METHOD FOR PROVIDING HOLES IN GLASS

Filed May 1, 1967

Joseph F. Hlista,
INVENTOR.
BY.
W H Mc Allister Jr.
ATTORNEY.

United States Patent Office 3,551,176
Patented Dec. 29, 1970

3,551,176
METHOD FOR PROVIDING HOLES IN GLASS

Joseph F. Hlista, Santa Ana, Calif., assignor to Hughes Aircraft Company, Culver City, Calif., a corporation of Delaware Filed May 1, 1967, Ser. No. 635,087
Int. Cl. B44d *1/52*
U.S. Cl. 117—5.5 2 Claims

ABSTRACT OF THE DISCLOSURE

A method for providing holes in glass layers comprising forming areas of polymerizable material where holes are to be provided, applying glass over the entire surface including the areas of polymerizable material and then treating these areas as to remove or destroy the same which also removes the glass thereover.

This invention relates to a method for providing holes in a glass layer disposed on a substrate, the holes being of any desired number or geometry. The method of the invention is particularly useful to provide holes through the glass of glass-coated articles of extremely small size. More particularly, but not necessarily exclusively, the invention relates to providing holes through a glass layer used to hermetically seal the surface of an electronic device and especially semiconductor devices or apparatuses.

While the invention will be described herein with particular reference to semiconductive apparatus, it will be readily appreciated that the invention is by no means limited to use on such apparatus and that the method of the invention is broadly useful wherever it is desired to have a glass layer having holes therethrough to expose some preselected underlying portion of the article on which the glass is coated. As used herein, semiconductive apparatus includes discrete semiconductor devices such as diodes or transistors, or substrates on which discrete semiconductive devices are to be mounted, or microminiature integrated circuitry wherein a plurality of semiconductive and other electronic or electrical components are formed in a substrate. Because of the susceptibility of semiconductive apparatus to the deleterious effects of the atmosphere or other contaminants to which it may be exposed, it is generally preferable, indeed necessary in most instances, to protect the semiconductive apparatus within hermetically sealed containers or by other means such as hermetic and electrically insulating layers of silicon dioxide or glass which may be bonded to a surface of the apparatus where the critical parts thereof are apt to be exposed to the atmosphere or other contamination. Since it is necessary to connect the semiconductive apparatus to other externally located circuits or electrical components, openings through such protective insulating layers or means must be provided through which openings the necessary electrical connections can be made to the desired underlying regions. Thus in a typical semiconductive apparatus such as a planar transistor wherein the emitter, base and collector regions are all disposed on a common surface of a semiconductor body, the common surface is generally provided with a protective insulating layer of oxide as well as a final overlying layer of glass. In order to make ohmic connections to the emitter, base and collector regions, holes are provided through the oxide and glass layers in which holes metal is deposited to make separate connections to the respective regions. In some instances, the metal is deposited on portions of an oxide protective insulating layer in the form of strips which terminate in connection regions disposed near the periphery of the device which connection regions are usually relatively larger in order to facilitate the making of external electrical connections as by soldering and the like. In such a device, it is preferred to deposit a layer of glass over the entire surface of the device leaving only the relatively larger connection areas exposed.

In the past, it was customary to use an etch such as hydrofluoric acid to remove the glass over the large connection areas and to thereby expose these areas. This etching technique required the necessity of forming a pattern of photosensitive polymerizable material on the surface of the device so as to expose only those areas of the glass which it is desired to remove. This result is achieved by photochemically polymerizing selected portions of the polymerizable material and removing the unpolymerized portions as by the use of a solvent therefor. The use of such an etchant contributed greatly to the low manufacturing yield of satisfactory devices because the etchant could attack useful areas of the device, particularly by undercutting at the areas where the glass was being removed. Another technique employed to avoid the use of etching procedures was to form the metal connection areas of relatively large height, then to apply the glass completely over these metal mounds or bumps as well as the rest of the surface of the semiconductor device and then lap off the glass from the top of the device to expose the bumps.

It is therefore an object of the invention to provide an improved method for forming holes in glass layers.

Another object of the invention is to provide an improved method for forming holes in glass layers bonded to the surface of semiconductive apparatus.

Yet another object is to provide an improved method for providing holes in glass layers without necessitating the use of etchants.

These and other objects and advantages of the invention are achieved by forming areas of polymerizable material on the surface of the article where it is desired to form a hole in a glass layer and polymerizing the same photochemically, for example. These areas of polymerizable material are, after the polymerization thereof, hereinafter referred to as "polymeric" areas. After forming the polymeric areas at such locations, glass is deposited over the entire surface including the polymeric areas. The glass over the polymeric areas is then removed by one of two methods. In the first method, a solution is employed which will dissolve the polymeric material so that the polymeric material comes loose and may be removed with the overlying glass portion being removed at the same time. In this method, the glass is not removed by chemical action between glass and the solution but by the reaction between the solution and the polymeric area. In the second method, the article with the glass disposed over the surface including the polymeric areas is heated to some temperature which causes the polymeric temperature to expand. The expansion of the polymeric material causes the overlying glass to pop off after which the underlying polymeric material can be removed by conventional cleaning techniques.

The invention will be described in greater detail by reference to the drawings in which FIG. 1 is a planned view of a planar transistor device;

Figure 1:
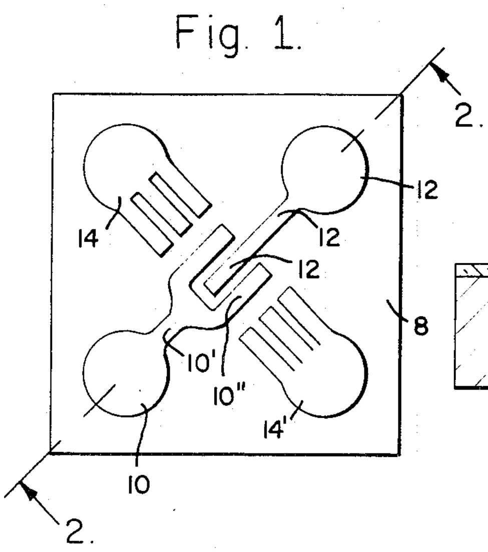
Figure 2:
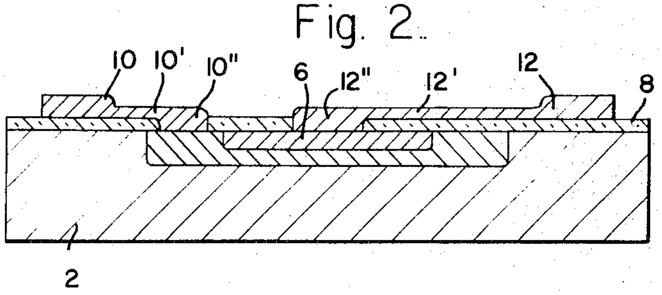
FIG. 2 is a cross-sectional elevational view taken along the line 2—2 thereof.

As mentioned previously, the method of the invention will be described with particular reference to a planar transistor device such as shown in the drawings, although it will be appreciated that the method of the invention is not exclusively limited for use in connection with such devices. In FIGS. 1 and 2, a planar transistor device is shown comprising a semiconductor body 2 which may be of silicon, for example, having a collector region provided by the bulk of the semiconductor body 2, a base region 4 provided adjacent one surface of the semiconductor body 2 and surrounded by the collector region, and an emitter region 6 disposed adjacent the same surface as the base region and surrounded thereby. It will thus be appreciated that the collector, base and emitter regions all have surfaces disposed at a common surface of the semiconductor body and that the junctions between the collector and base regions and between the base and emitter regions all terminate at this common surface. Disposed on this common surface of the semiconductor body 2 is an overlying layer 8 of silicon dioxide, for example, which is bonded to the surface of the semiconductor body. As is well known in the art, this silicon dioxide layer is used in the fabrication by diffusion of the base and emitter regions and it is left intact on the surface to protect these regions and particularly the junctions formed in the semiconductor body. In order to provide connections to the various regions of the transistor device, openings are formed through the silicon dioxide layer 8 to expose portions of the base, emitter and collector regions in any desired geometry. Metal (for example, aluminum) is then vapor-deposited over the surface of the oxide layer 8 and through the openings therein to contact the underlying regions as desired. Since the emitter and base regions are usually of extremely small size, metal is also usually vapor-deposited at the same time so as to extend over the oxide layer 8 from the openings provided therein to desired peripheral portions on the surface of the semiconductor body whereat relatively large areas of deposited metal are provided for connection purposes. Thus, with particular reference to FIG. 1, a relatively large connection area 12 is provided for the emitter region 6 and connected by a metal strip 12′ which is formed integrally with the large connection area 12 and a contact 12″ to the emitter region 6. In a similar fashion, a large base connection area 10 is provided and connected to the base contact (10″) by a connecting strip (10′). Also shown in FIG. 1 is a connection area 14 for the collector region 2. An additional connection region 14′ may also be provided as is sometimes desirable.

The method of the invention is particularly useful for providing an overlying protective layer of glass on the surface of the transistor device shown in FIGS. 1 and 2 with the connection areas 10, 12 and 14 being exposed through the holes in the glass for external connection purposes.

Figure 3:
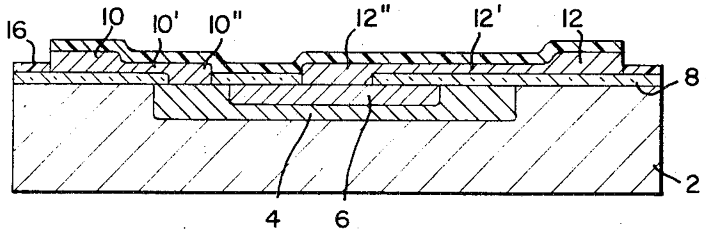
FIGS. 3–6 are similar cross-sectional views of the transistor device shown in FIG. 1 taken along the line 2—2 thereof at further succeeding stages processed thereof according to the method of the present invention.

With particular reference to FIG. 3, a thin film of polymerizable material is first applied over the entire surface of the device. Typically, this material may be any of the photosensitive resins known throughout the industry as a "photoresist." A photoresist is particularly desired for use in the method of the invention since it is light-sensitive and may be readily formed into a desired pattern by exposure to light as through a mask, for example. A suitable photosensitive polymerizable material for this purpose may be polyvinyl alcohol, for example, or products well known on the market and sold under the trade designation of Kodak Photo Resist (KPR) or Kodak Thin Film Resist (KTFR) by Eastman Kodak Company and believed to be polyvinyl cinnamate obtained by esterification of a polymeric material having hydroxyl groups in their molecule with a cinnamic acid halide. For a more complete description of light-sensitive polymeric material suitable for use in the present invention, reference is made to the text "Light-Sensitive Systems" by J. Kosar (John Wiley & Sons, Inc., N.Y., 1965), pages 140 et seq. Upon exposure to light, the photoresist film undergoes a chemical change so that the unexposed portions may be dissolved by a solvent which will not dissolve or affect exposed portions. Thus the exposed portions will remain in place while the unexposed portions are removed by the action of the solvent.

Figures 4, 5:
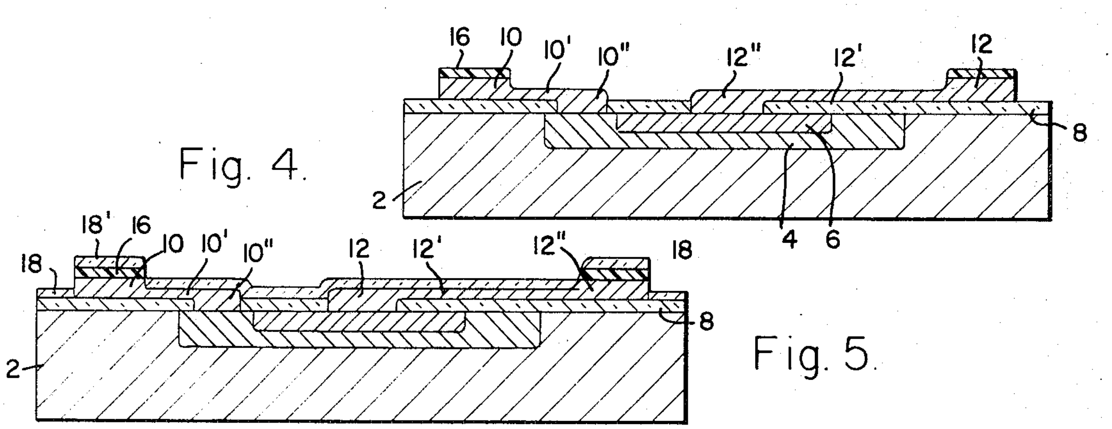
Figure 6:
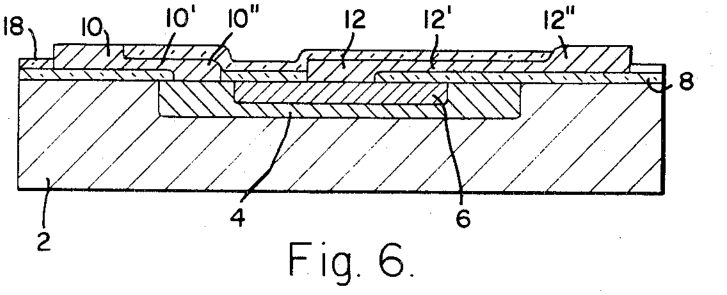

With reference to FIG. 4, unexposed portions of the photoresist film 16 are next removed everywhere from the surface of the device while leaving exposed polymeric film over the connection areas 10, 12 and 14. A typically suitable solvent for this purpose may be one such as methyl ethyl ketone, trichloroethylene or Kodak Metal Etch Resist Developer (KMERD) sold by Eastman Kodak Company.

With respect to FIG. 5, a layer 18, 18′ and 18″ of glass is formed as by vapor-depositing or sputtering glass over the entire surface of the device including the exposed metal interconnection strips 10′ and 12′ and the photoresist or polymeric portions 16 which are positioned on the connection areas 10, 12 and 14.

The next step is to remove the glass 18′ and 18″ from over the connection areas 10, 12 and 14. This is accomplished by immersing the device in a solution which dissolves the underlying polymerized material 16. A suitable solution for this purpose may be one of the aforementioned solvents for the unpolymerized material except that longer times may now be required to affect the polymerized material and soften the same for removal thereof which action may also be enhanced by agitation or the like. In general, the solution is able to reach these polymerized areas 16 notwithstanding the coating of glass thereover by one of two procedures. Since the glass is vapor-deposited on the surface from above the transistor device, little or no glass is deposited on lateral surfaces, hence the lateral surfaces of the polymeric area 16 can be reached by the polymeric dissolving solution so as to remove these polymeric areas and thus free the overlying glass portions 18′ and 18″. It has also been observed that when glass is sputtered over a polymeric substance, the surface of the glass over such areas is discontinuous or porous and has a wrinkled appearance. Such porosity and wrinkling occurs because glass has a greatly different coefficient of expansion from that of the polymeric material. The solution is thus able to penetrate the glass and reach the underlying polymeric material and dissolve the same so that the glass comes loose with it.

Alternatively, instead of using a solution method, the device as shown in FIG. 5 may be placed in an oven and heated to a temperature which causes the polymeric material to polymerize preferably to the point of charring. Upon such heating, the polymeric material expands rapidly and in effect mechanically "pops" the overlying glass free from the surface. By allowing the polymeric material to be heated to the charring point, its removal is facilitated as by standard cleaning procedures such as by rinsing and scrubbing in water, for example.

There thus has been described an improved method for providing holes in bonded glass layers and the like. It has been discovered that the method of the invention is most efficacious if the thickness of the polymeric material under the glass is not too thin with respect to the thickness of the overlying glass. Preferably the polymeric material is at least half as thick as the glass. In a typical example, a polymeric area about 3–4 microns in thickness was employed in conjunction with a glass film about 6–7 microns in thickness. If thinner polymeric films are employed, the overlying glass may still be removed by the methods of the invention but considerably longer processing times are required.

What is claimed it:

1. The method of providing an article of manufacture with a protective film of glass having an opening therethrough comprising the steps of:

(1) providing on a surface of said article a film of polymeric material corresponding in shape and size to the opening to be provided in said glass film, said polymeric material being selected from the group consisting of polyvinyl alcohol and polyvinyl cinnamate;

(2) forming a film of glass over said surface of said article including said film of polymeric material;

(3) and heating said article until the expansion of said polymeric film causes the portion of said glass film thereover to be separated from the remainder of said glass film.

2. The method according to claim 1 wherein said film of polymeric material is at least half as thick as said film of glass thereover.

References Cited

UNITED STATES PATENTS

| | | | |
|---|---|---|---|
| 2,666,008 | 1/1954 | Enslein et al. | 96—36.2 |
| 2,999,034 | 9/1961 | Heidenhain | 117—5.5 |
| 3,020,156 | 2/1962 | Rowe | 96—36.2 |
| 3,300,339 | 1/1967 | Perri et al. | 117—212 |
| 3,365,321 | 1/1968 | Adler | 117—5.5 |

NORMAN G. TORCHIN, Primary Examiner

J. R. HIGHTOWER, Assistant Examiner

U.S. Cl. X.R.

96—36.2